(12) United States Patent
Orchard-Webb

(10) Patent No.: US 6,204,164 B1
(45) Date of Patent: Mar. 20, 2001

(54) METHOD OF MAKING ELECTRICAL CONNECTIONS TO INTEGRATED CIRCUIT

(75) Inventor: Jonathan H. Orchard-Webb, Kanata (CA)

(73) Assignee: Mitel Corporation, Kanata (CA)

( * ) Notice: Subject to any disclaimer, the term of this patent is extended or adjusted under 35 U.S.C. 154(b) by 0 days.

(21) Appl. No.: 09/011,899

(22) PCT Filed: Jul. 24, 1996

(86) PCT No.: PCT/CA96/00501

§ 371 Date: Apr. 29, 1998

§ 102(e) Date: Apr. 29, 1998

(87) PCT Pub. No.: WO97/07538

PCT Pub. Date: Feb. 27, 1997

(30) Foreign Application Priority Data

Aug. 21, 1995 (CA) .................................................. 2156941

(51) Int. Cl.[7] .................................................. H01L 21/44
(52) U.S. Cl. .................................................. 438/615; 438/106
(58) Field of Search .................................................. 438/108, 106, 438/118, 612, 613, 614, 615, 110; 228/121, 123.1, 180; 29/840

(56) References Cited

U.S. PATENT DOCUMENTS

| | | | |
|---|---|---|---|
| 3,465,150 | * 9/1969 | Hugle | 250/83.3 |
| 3,486,223 | * 12/1969 | Butera | 29/626 |
| 3,781,596 | * 12/1973 | Galli et al. | 317/101 |
| 3,997,963 | * 12/1976 | Riseman | 438/461 |
| 4,032,058 | * 6/1977 | Riseman | 228/180 |
| 4,442,966 | * 4/1984 | Jourdain et al. | 228/123 |
| 4,693,770 | * 9/1987 | Hatada | 156/151 |
| 4,819,857 | * 4/1989 | Mizuishi et al. | 228/121 |
| 4,927,069 | * 5/1990 | Ushikubo et al. | 228/123 |
| 5,068,714 | * 11/1991 | Seipler | 257/703 |
| 5,384,952 | * 1/1995 | Matsui | 29/840 |
| 5,897,341 | * 4/1999 | Love et al. | 438/125 |

FOREIGN PATENT DOCUMENTS 60-68637 * 4/1985 (JP) .
60-116157 * 6/1985 (JP) .

* cited by examiner

Primary Examiner—Olik Chaudhuri
Assistant Examiner—Alonzo Chambliss
(74) Attorney, Agent, or Firm—Marks & Clerk

(57) ABSTRACT

In a method of making electrical connections to an integrated chip, an oxide layer is formed on the surface of the chip and a substrate carrying electrical connections. The conductors on the chip are accurately aligned with the conductors on the substrate. An oxide layer formed on the surface of the chip is then fusion bonded to an oxide layer on the substrate and voids remaining between the conductors filled with a conductive material. This method removes the limitation imposed by the large pad size needed for conventional techniques.

9 Claims, 2 Drawing Sheets

Conventional Structure

Conventional Structure

METHOD OF MAKING ELECTRICAL CONNECTIONS TO INTEGRATED CIRCUIT

This invention relates to a method of making electrical connections to an integrated circuit (i.c.) chip.

Electrical connection between the chip circuitry and the integrated circuit package is most commonly accomplished by employing wire bonding techniques. For hermetic packages, the preferred technique is to ultrasonically bond aluminum wires to bonding pads on the i.c. chip, and for plastic packages, the preferred method is to form balls on gold wire and to use thermal compression to attach these balls to bonding pads on the integrated circuit.

Since the bonding wires are about 1 mil or larger diameter, the pad size has to be a few mils across to accommodate the bond. Signal wires leading form the bonding pad to the i.c. circuitry may be 0.5 $\mu$m wide, and are projected to continue to get smaller as technology improves.

More recently, techniques have been developed whereby the chip is attached face downwards on the substrate using tiny solder balls. This technique is used in ball grid arrays which allow a very high number of connections to be made to the i.c. A large pad is still required for the solder ball, however, and multiple layers of substrate interconnect may be needed to access the pads. Such a method is described in PCT patent application WO87/01509.

An object of the invention is to remove the limitation imposed by the large pad size needed for conventional assembly techniques (e.g. wire bonding, ball grid arrays or beam lead), and to provide a high conductivity path for heat to flow from the chip active area to the substrate.

Accordingly the present invention provides a method of making electrical connections to an integrated circuit chip, comprising the steps of providing at least one chip having exposed conductors on its active surface, providing a substrate having conductors on its surface corresponding to said exposed conductors on the chip, and mounting said at least one chip on said substrate so that said conductors are in accurate alignment with the corresponding conductors on the substrate, wherein a first oxide layer is formed on said active surface of said chip, a second oxide layer is formed on said surface of said substrate, said oxide layers are joined together by fusion bonding, and any voids between the conductors on the chip and the corresponding conductors on said substrate are filled with a conductive material.

One or a plurality of chips can be mounted on the substrate.

Fusion bonding is a technique by which two materials are bonded together by bringing their oxide covered surfaces together under temperature and pressure. The process produces a very strong bond. The system can be made to provide almost perfect thermal expansion matching between the two silicon components and the attachment layer, which is silicon dioxide in the case of silicon based technologies.

The method also provides an extremely low thermal path for heat dissipation from the chip to the substrate (approximately 0.03 deg C/Watt chip to substrate, and less than 1 deg C/Watt spreading resistance into the bulk substrate for a 1 cm square chip).

The electrical interconnection is made between narrow conductors on the chip and accurately aligned narrow conductors on the substrate. Both sets of conductors can be formed using i.c. photolithographic techniques, and chip to substrate alignment can be performed using through-the-chip infrared alignment techniques.

An important aspect of the invention the use of a fine gap between the chip conductor and the substrate conductor, which is subsequently bridged with a conductor. Bridging may be accomplished by capillary flow of a solder, or by surface wetting by a solder. Alternatively, a conductive plastic may be used to make the bridge.

The invention also provides an integrated circuit package comprising an integrated circuit having conductors on its active surface, a substrate having conductors on its surface corresponding to said exposed conductors on the chip, characterized in that a first oxide layer is present on said active surface of said integrated circuit, a second oxide layer is present on the surface of said substrate, said surfaces being joined together by fusion bonding of said oxide layers, and any voids between the conductors on the integrated circuit and the corresponding conductors on said substrate are filled with a conductive material.

The invention will now be described in more detail, by way of example only, with reference to the accompanying drawings, in which.

Figure 1:
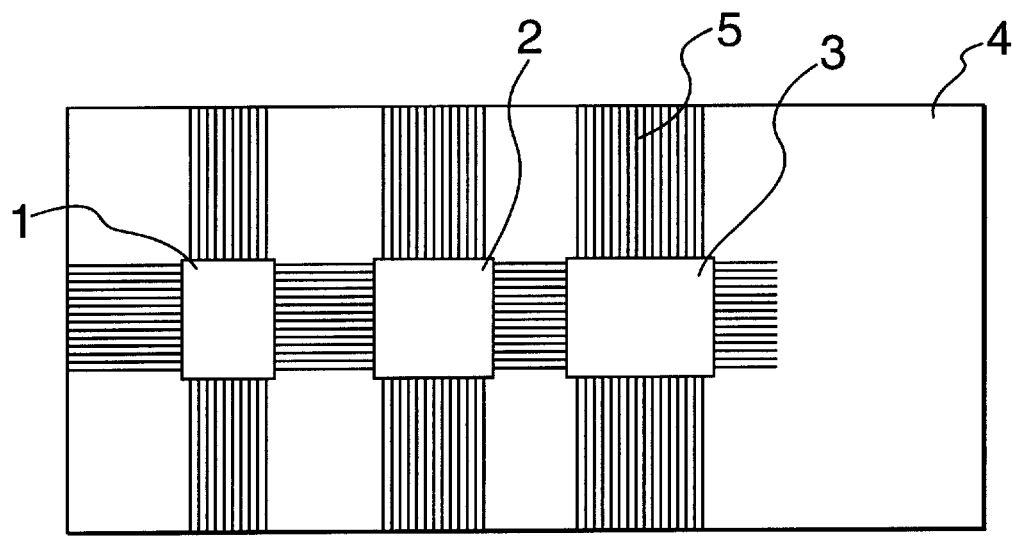
FIG. 1 is a plan view of an integrated circuit assembly.

FIG. 1 shows a series of chips 1, 2, 3 bonded to a silicon substrate 4 having patterned conductors 5 forming lead wires on its upper surface. The substrate 4 is subsequently diced to form the individual i.c. packages, and the lead wires 5 can be fanned out and connected to external pins of an i.c. package in a conventional manner.

Figure 2:
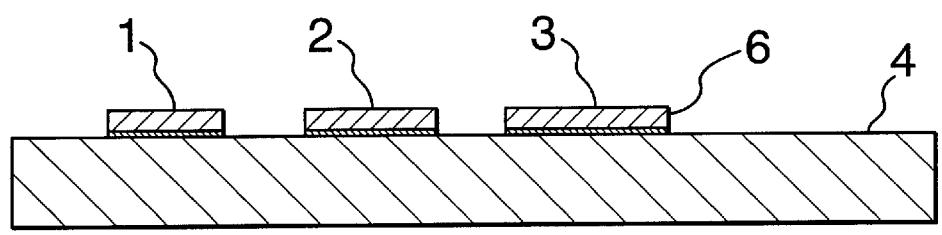
FIG. 2 is a cross section through the assembly shown in FIG. 1.

FIG. 2 shows the chips 1, 2, 3 fusion bonded to the substrate 4 with the fusion bond 6.

In order to make the assembly shown, a silicon wafer containing a large number of chips is first prepared. The wafer has exposed narrow signal conductors, in the order of 0.5$\mu$wide, on its active surface. These are the signal conductors that in a conventional arrangement would be attached to bonding pads.

A thick passivation layer of silicon dioxide is then formed on the active surface. The passivation layer is preferably doped to match its thermal expansion with silicon.

Next a mask is applied and the conductors exposed using conventional etching techniques. The exposed conductors can at this point be plated with an easily wettable metal, such as gold.

The active surface of the wafer is then lapped to give a very flat surface using techniques currently employed in multilevel metallization. The wafer is then diced to form the chips 1, 2, 3.

Meanwhile the silicon substrate 4 is prepared. The narrow leads 5 are first patterned onto the surface of the substrate 4 in positions matching corresponding conductors on the chips. The narrow leads have can have a width matching that of the signal conductors in the chips. A silicon dioxide bonding layer is then formed on the surface of the substrate.

The chips 1, 2, 3 are then mounted face downward on the substrate 4 and aligned using through-the-chip infrared techniques (for example, using a system manufactured by Karl Zeiss). Once aligned the chips 1, 2, 3 are fusion attached by applying heat and pressure at temperatures in the range of 300° C. to 650° C.

Finally, an electrical connection is established between the chip and substrate leads by using a solder flow technique to fill the tiny voids between the chip and substrate metallizations sufficiently to establish an electrical connection between the circuit and substrate metallizations.

Figure 3:
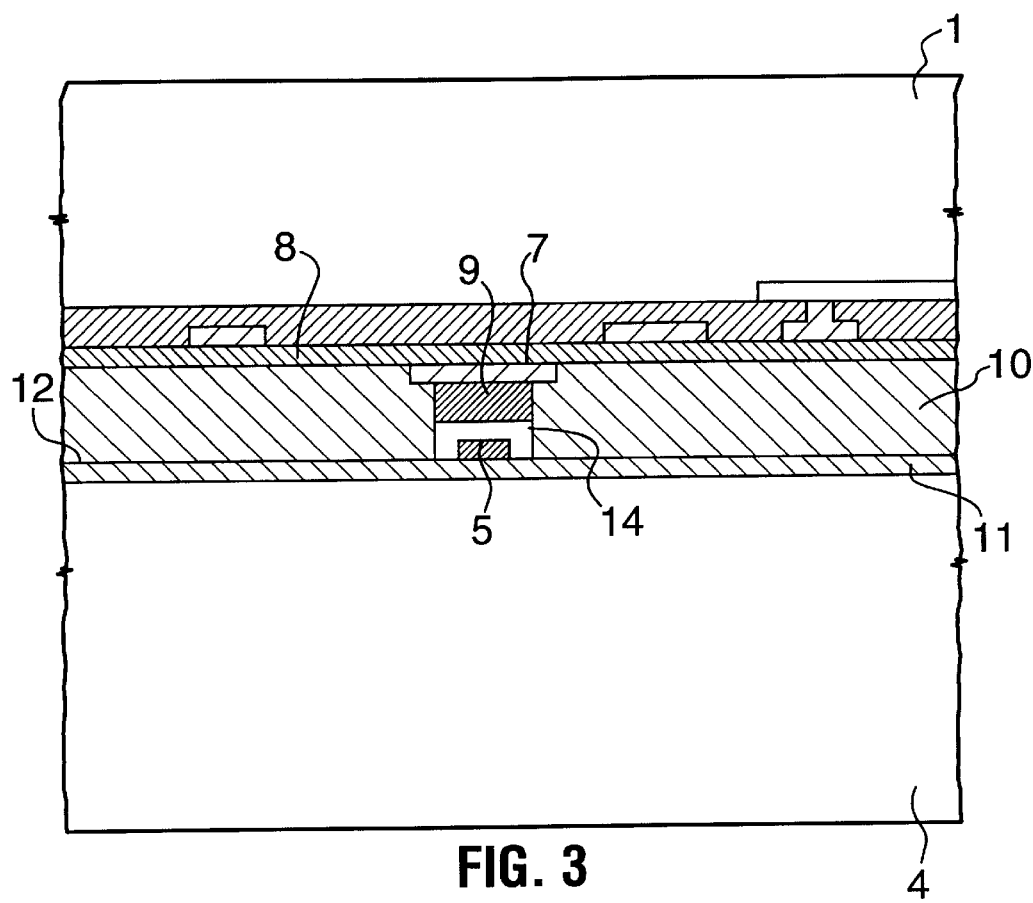
FIG. 3 is a detailed cross section of a single bonded chip.

FIG. 3 shows an integrated circuit 1 bonded to the substrate 4 in accordance with the invention. In FIG. 3, signal wire 7 faces lead wire 5 on the substrate 4. The signal wire 7 is formed on the active surface 8 of the chip 1. The exposed signal wire 7 is plated with gold 9. Voids 14 are filled using a solder flow technique.

Thick silicon dioxide passivation layer 10 is located on the active surface 8 of the chip 1. This layer may, for example, 2 to 3 microns thick when deposited and then lapped down to about 1 micron thick.

The upper surface of the substrate 4 has a silicon dioxide layer 11 formed thereon that is used to form a fusion bond 12 with the passivation layer 10.

Figure 4:
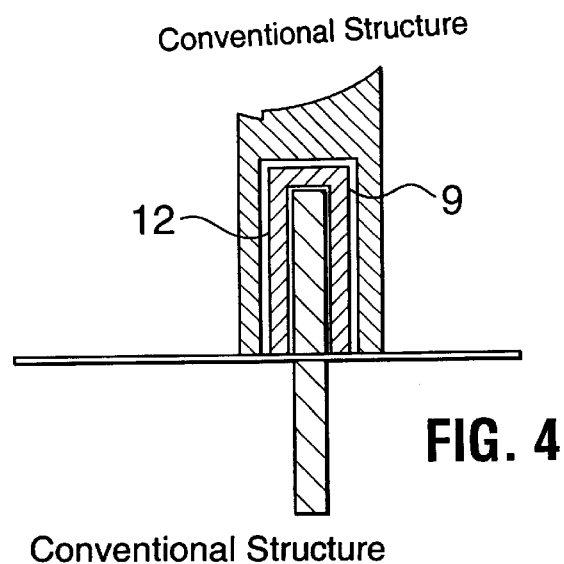
FIG. 4 is a detail of the chip to substrate metallization connection.

FIG. 4 is a part sectional view looking down onto the connection at the edge of the chip. Lead wire 5 can be seen terminating under plated metal portion 9, which is surrounded by a passivation window 12.

A key aspect of this invention is attachment of the front (active) surface of the chip to the substrate. Many methods are available for producing the passivating dielectric that is bonded to the substrate, and the dielectric can be made of several different layers to meet the requirements of i.c. processing. In the example given, a borosilicate glass might be used as the passivation layer because the thermal expansion coefficient is well matched to silicon. Other glasses could be used. Several techniques are in use for planarizing oxides; it may be possible, especially for small chips, to dispense with the lapping processes.

Another key aspect is the small gap between the metallization layers, which is subsequently filled with a conductive material. In the example given, the chip oxide was etched back to expose the metal conductor. This is the same function as the pad etch used in conventional processing. Alternatively, the substrate could be recessed to provide a small gap between the conductors. Many metallization techniques are in use for i.c. processing, and the optimum metallization process may be tailored to fit a given i.c. process or application.

The example given is for the silicon on silicon multichip module (MCM). The technique is, however applicable to other materials used for hybrid assemblies, provided that the materials are chosen to produce acceptably low stress between the chip and substrate. For example, a glass coated ceramic substrate might be used. The technique could also be used for semiconducting materials other than silicon provided that a suitable oxide coating is used for the fusion bond. The technique might also find application in conventional single chip packaging where very high pin counts are needed.

The invention greatly alleviates four problems associated with i.c. technology, namely the pad-limited layout for submicro circuits, pin limited packaging due to the large area need for bonding plots and solder balls; stress generated between the i.c. and the package substrate; and the high thermal resistance between the i.c. and the substrate (An order of magnitude improvement can be achieved over prior art techniques).

What is claimed is:

1. A method of making electrical connections to an integrated circuit chip, comprising the steps of:

providing at least one chip having conductors on its active surface, forming a first oxide layer on said active surface leaving said conductors exposed;

providing a substrate with a second oxide on its surface having conductors corresponding to said exposed conductors on said at least one chip;

applying a mask to said first oxide layer and etching through said first oxide layer to expose the conductors;

lapping said etched first oxide layer to provide a flat surface;

subsequently mounting said at least one chip on said substrate so that said conductors of said chip are in accurate alignment with the corresponding conductors on the substrate;

joining said first and second oxide layers together directly by fusion bonding said oxide layers together without an adhesive; and filling any voids between the conductors on said at least one chip and the corresponding conductors on said substrate with a conductive material using a solder flow technique.

2. A method as claimed in claim 1, wherein said first oxide layer is doped to match its thermal expansion with the substrate and said at least one chip.

3. A method as claimed in claim 2, wherein said voids are filled with a conductive material using a solder flow technique.

4. A method as claimed in claim 1, wherein said fusion bonding takes place at temperatures in the range of 300° C. to 650° C.

5. A method as claimed in claim 1, wherein the conductors are plated with an easily wettable material.

6. A method as claimed in claim 5, wherein said easily wettable material is gold.

7. A method as claimed in claim 1, wherein said at least one chip is aligned using through-the-chip infrared techniques.

8. A method as claimed in claim 1, wherein said conductors are provided by first forming a metal deposition layer on said substrate and then patterning said metal deposition layer to form said conductors on said substrate.

9. A method as claimed in claim 1, wherein said substrate is silicon.

* * * * *